United States Patent [19]

Shirakawa

[11] Patent Number: 4,952,830
[45] Date of Patent: Aug. 28, 1990

[54] BRUSHLESS MOTOR WITH HALL ELEMENTS

[75] Inventor: Hiroyuki Shirakawa, Himeji, Japan

[73] Assignee: Mitsubishi Denki Kabushiki Kaisha, Tokyo, Japan

[21] Appl. No.: 410,446

[22] Filed: Sep. 21, 1989

[30] Foreign Application Priority Data

Sep. 22, 1988 [JP] Japan .................. 63-239408

[51] Int. Cl.⁵ .............................................. H02K 11/00
[52] U.S. Cl. ................... 310/68 B; 310/68 R; 310/DIG. 3
[58] Field of Search .............. 310/43, 68 R, 68 B, 310/DIG. 3; 318/138, 254

[56] References Cited

U.S. PATENT DOCUMENTS

| 4,011,476 | 3/1977 | Beard ............... | 310/DIG. 3 |
| 4,259,603 | 3/1981 | Uchiyama et al. ....... | 310/68 B |
| 4,482,849 | 11/1984 | Doemen et al. ....... | 318/254 |
| 4,638,197 | 1/1987 | Kalagidis ............ | 310/68 R |
| 4,818,907 | 4/1989 | Shirotori ............. | 310/67 R |
| 4,847,527 | 7/1989 | Dohogne ............. | 310/68 B |

FOREIGN PATENT DOCUMENTS

| 2515438 | 4/1983 | France ............. | 310/68 R |
| 0201668 | 11/1984 | Japan ............. | 310/68 R |
| 63-1020 | 1/1988 | Japan . | |
| 0043044 | 2/1989 | Japan ............. | 310/68 B |
| 0069241 | 3/1989 | Japan ............. | 310/68 R |

OTHER PUBLICATIONS

Y. Dote and T. Konishita: "Fundamentals and Applications of Brushless Servo Motor", p. 45, Sogodenshi Shuppanasha (publication date unclear).

Primary Examiner—Steven L. Stephan
Assistant Examiner—C. E. LaBalle
Attorney, Agent, or Firm—Sughrue, Mion, Zinn, Macpeak & Seas

[57] ABSTRACT

A brushless motor in which the Hall elements are mounted around a sub-magnet by means of a holder and a printed circuit board is disclosed. The holder comprises a semicircular disk-shaped base portion and a semicircular cylindrical extension portion extending therefrom to oppose the outer circumferential surface of the sub-magnet across a small radial gap, wherein a plurality of rectangular bores for accommodating the Hall elements are formed in the extension portion at a fixed circumferential pitch, each bore having an axial depth substantially greater than the length of Hall elements. The Hall elements accommodated in respective bores are sealed by an adhesive, and the semicircular disk-shaped printed circuit board is attached on the base portion of the holder by means of a mortice and tenon joint, to close the bores of the holder. The leads of the Hall elements are soldered to the printed circuit pattern formed on the back surface of the printed circuit board. The holder and the printed circuit board fixed to each other are mounted together to the rear bracket of the motor.

5 Claims, 4 Drawing Sheets

BRUSHLESS MOTOR WITH HALL ELEMENTS

BACKGROUND OF THE INVENTION

This invention relates to brushless motors utilizing Hall elements as the sensor for detecting the position of the rotor, and more particularly to the mounting structure of the Hall elements therein.

Brushless motors utilizing Hall elements as the sensor for detecting the rotor position are now widely used in the field where precise control of the rotation of the motor is essential. In such motors, the rotational position of the rotor is detected by the Hall elements, and, in response thereto, the directions of the currents supplied to the stator coils are switched over in turn by power transistors so as to produce a rotating magnetic field and to obtain the torque of the rotor. However, the outputs of the Hall elements, which utilize the Hall effect to detect the magnetic field generated by a magnet fixed on the rotor shaft, are dependent on their attitude. Thus, it is important that the detector surface of the Hall elements are precisely positioned with respect to the magnet fixed on the rotor shaft.

Japanese Patent Publication No. 63-1020 discloses a mounting structure of Hall elements in brushless motors whereby a double-sided printed circuit board is utilized: the printed circuit board comprises notches formed on the inner surface of the annular portion thereof surrounding an axial end of the rotor, and the Hall elements are fitted into these notches so as to bridge the printed circuit patterns formed on both surfaces of the circuit board. This method of mounting, however, requires a double-sided printed circuit board and is rather complicated. FIGS. 1 through 3, on the other hand, show a simpler mounting structure in which a one-sided printed circuit board is utilzed for the mounting of the Hall elements:

FIG. 1 shows the overall structure of a frameless type brushless motor in which the Hall elements are mounted by means of a one-sided printed circuit board. The stationary part of the motor includes: an annular stator core 1, stator coils 1a wound around the stator core 1, and cup-shaped front and rear brackets 2a and 2b secured to the stator core 1 to form the housing structure of the motor. On the other hand, the rotor 3 of the motor comprises: a rotor shaft 4 rotatably supported by a pair of bearings 5a and 5b sucured to the front and rear brackets 2a and 2b, respectively; and a rotor core 6a and a main magnet 6b coaxially secured to the rotor shaft 4. Thus, the rotor 3 is free to rotate within the stator core 1. Further, to the rear side of the rotor 3 (to the right in the figure), an annular sub-magnet 7 is secured to the rotor shaft 4 to generate the magnetic field for the determination of the position of the rotor 3.

The mounting structure of the Hall elements is best shown in FIG. 2 which shows the cross section of the motor along the line A—A of FIG. 1. The Hall elements 8 (three in number in the fugure) are secured via respective holders 9 of a non-magnetic electrically insulating material to a semi-circular annular one-sided printed circuit board 10, so as to oppose the outer side surface of the submagnet 7 across a small radial gap. The Hall elements 8, which are, as is well known, molded into packages of epoxy resin, etc., are circumferentially spaced from each other by 60 degrees, and detect the variation of the magnetic field generated by the sub-magnet 7 to determine the position of the rotor 3. The semi-circular printed circuit board 10 having a printed circuit formed on the rear surface (at the right side in FIG. 1) is secured to the bottom surface of the rear bracket 2b via a plurality of fixing screws 11. As best shown in FIG. 3, each Hall element 8 is partially inserted into a holder 9 at the rear end thereof, to be supported by the holder 9 in the state of a cantilever, each Hall element 8 and holder 9 being fixed to each other and to the printed circuit board 10 by means of an adhesive 12; in addition, the four leads 8a of each Hall element 8 are electrically coupled via solder 13 to the electrically conductive pattern 10a formed on the rear surface of the printed circuit board 10.

The above mounting structure of the Hall elements 8 in brushless motors has the following disadvantage. Namely, the Hall elements 8 are each supported by the holder 9 in the state of a cantilever; thus, when the Hall element 8 are subjected to vibrations, especially to those in the direction Y shown in FIG. 3, the leads 8a and the solder 13 may suffer an electrical disconnection due to the fatigue failure thereof, which results in the disablement of the motor. Further disadvantage of the above mounting structure is that the application of the adhesive 12 requires an expert skill and is low in the operation efficiency.

SUMMARY OF THE INVENTION

It is a primary object of this invention therefore to provide a brushless motor having Hall elements as the rotor position sensor, wherein the mounting structure of the Hall elements is enhanced in the strength against vibrations as well as in the production efficiency.

An additional object of this invention is to provide a brushless motor of the above type in which the Hall elements are effectively protected from intrusion of water.

The above objects of this invention are accomplished in accordance with the principle of this invention by a mounting structure of the Hall elements whereby the Hall elements are completely accommodated in the rectangualr bores formed in a holder. The motor comprises a sub-magnet fixed on the rotor shaft for generating the magnetic field for the determination of the rotor position, and the holder comprises a semicircular cylindrical extension portion surrounding the outer circumferential surface of the sub-magnet across a small radial gap. The rectangular bores each having dimensions capable of completely accommodating a Hall element therein are formed in this extension portion of the holder at a predetermined circumferential pitch. The Hall elements are accommodated within the bores of the holder to be separated from each other by a predetermined circumferential pitch and to oppose the outer circumferential surface of the sub-magnet across a small radial gap. A printed circuit board having a printed circuit pattern on the back surface thereof is attached to the holder (by means of a mortise and tenon joint, for example) to close the openings of the bores of the holder, and the leads of the Hall elements are passed through the through-holes formed in the printed circuit board to be electrically connectd to the printed circuit pattern formed on the back surface of the board. The holder and the printed circuit board that are fixedly secured to each other are mounted together to the housing structure of the motor. It is preferred that the bores have axial depths substantially greater than the length of the Hall elements, and the recesses left above the Hall elements at the opening of the bores are filled by an adhesive.

The novel features which are believed to be characteristic of this invention are set forth with particularity in the appended claims. This invention itself, however, both as to its structure and method of assembly, together with further objects and advantages thereof may best be understood from the detailed description of the preferred embodiment taken in conjunction with the accompnaying drawings.

BRIEF DESCRIPTION OF THE DRAWINGS

In the drawings, like reference numerals represent like or corresponding portions.

DETAILED DESCRIPTION OF THE PREFERRED EMBODIMENT

Figure 4:
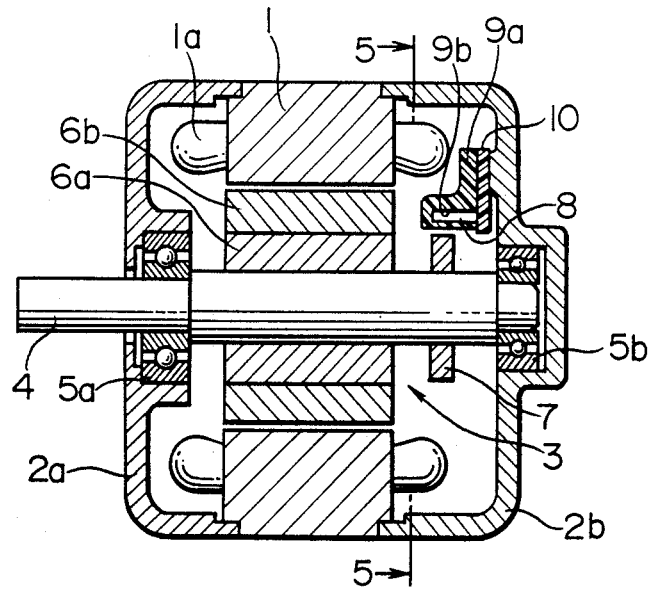
FIG. 4 is a view similar to that of FIG. 1, but showing a motor in which the Hall elements are mounted by means of a mounting structure according to this invention.
Figure 5:
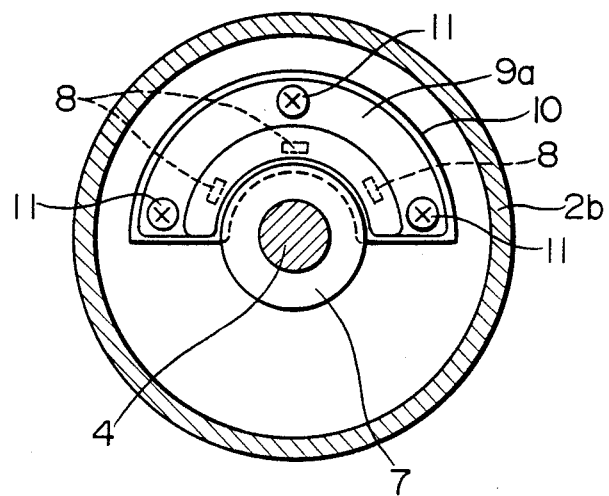
FIG. 5 is a transverse sectional view of the motor of FIG. 4 along line A—A shown therein.
Figure 6:
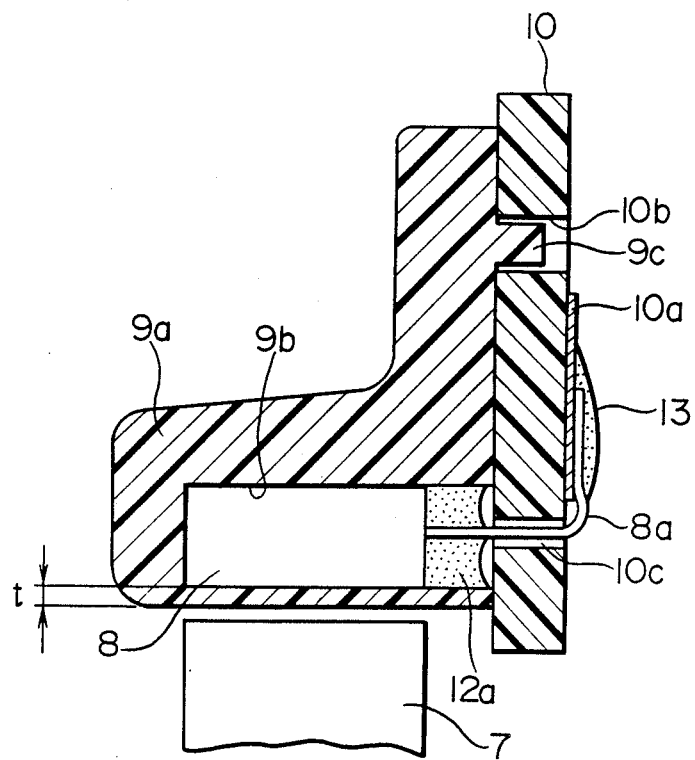
FIG. 6 is an enlarged axial sectional view of the portion around a Hall element of the motor of FIG. 4.

Referring now to FIGS. 4 through 6 of the drawings, an embodiment of this invention is described.

Figure 1:
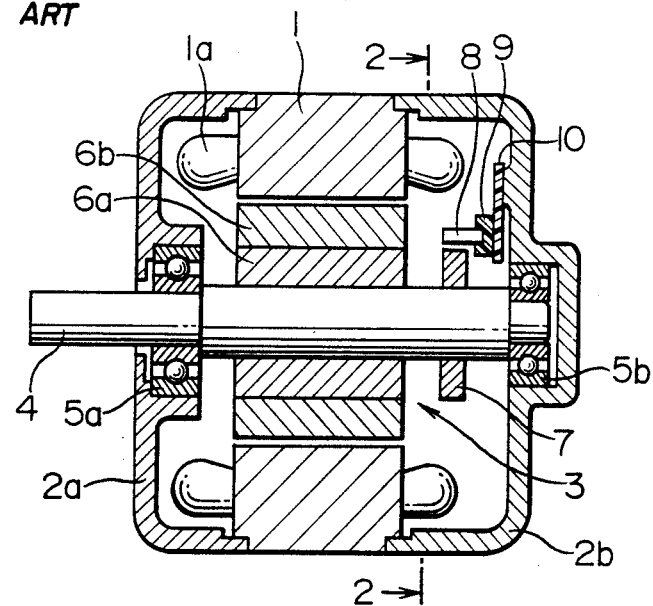
FIG. 1 is an axial sectional view of a brushless motor in which the Hall elements are mounted by means of a conventional mounting structure.
Figure 2:
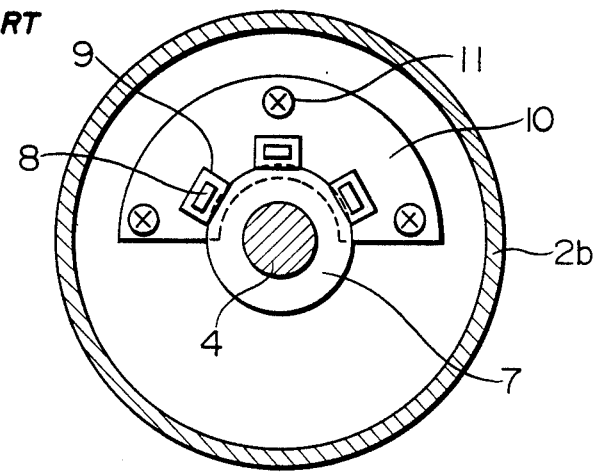
FIG. 2 is a transverse sectional view of the motor of FIG. 1 along line A—A shown therein.
Figure 3:
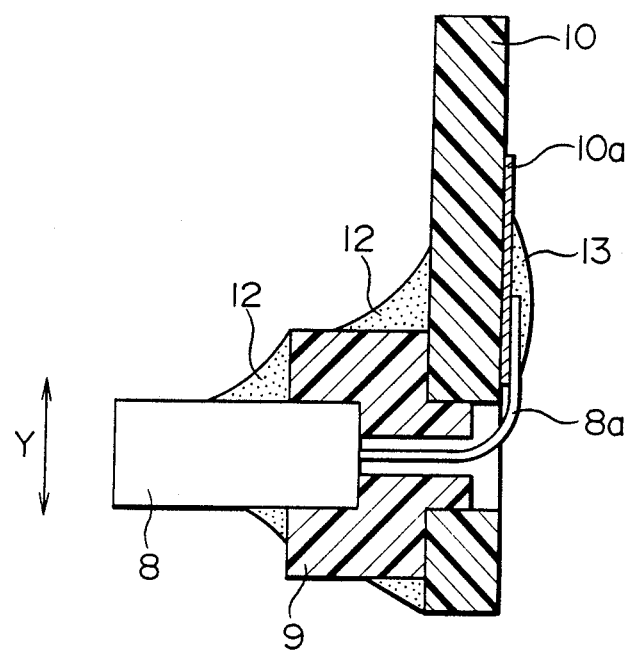
FIG. 3 is an enlarged axial sectional view of the portion around a Hall element of the motor of FIG. 1.

FIG. 4 shows the overall structure of a 3-phase 4-pole frameless type brushless motor having Hall elements mounted according to this invention. The motor is similar to that shown in FIG. 1. Thus, as shown in FIG. 4, the stationary part of the motor includes: an annular stator core 1, stator coils 1a wound around the stator core 1, and cup-shaped front and rear brackets 2a and 2b secured to the stator core 1 so as to hold the stator core 1 therebetween and to form the housing structure of the motor together with the stator core 1. On the other hand, the rotor 3 of the motor comprises: a rotor shaft 4 rotatably supported by a pair of bearings 5a and 5b sucured to the front and rear brackets 2a and 2b, respectively; and a rotor core 6a and a main magnet 6b coaxially secured to the rotor shaft 4. Thus, the rotor 3 is free to rotate within the stator core 1. Further, to the rear side of the rotor 3 (to the right in the figure), an annular disk-shaped sub-magnet 7 having a plurality of poles formed at the circumference thereof is secured to the rotor shaft 4 to generate the magnetic field for the determination of the position of the rotor 3.

The mounting structure of the Hall elements 8 according to this invention is best shown in FIGS. 5 and 6, which show, respectively, the transverse cross section of the motor along the line A—A in FIG. 4 and an enlarged axial cross section thereof around a Hall element. The three Hall elements 8, molded into rectangular box-shaped packeges of an epoxy resin, etc., are mounted by means of a holder 9a and a printed circuit board 10 to oppose the outer side surface of the sub-magnet 7 across a small radial gap at a circumferential pitch of 60 degrees; the mounting of the Hall elements 8 is effected as follows:

The holder 9a, made of a non-magnetic electrically insulating material such as a synthetic resin, comprises a semi-circular annular disk-shaped base portion (at the right side in FIGS. 4 and 6) and a semi-circular cylindrical axial extension portion extending axially forward (toward left in FIGS. 4 and 6) from the base portion to surround and oppose the side surface of the sub-magnet 7 across a small annular radial gap. The three rectangular bores 9b are formed in the axial extension portion of the holder 9a, to be circumferentially spaced from each other by 60 degrees. The depth (axial dimension) of the bores 9b is substantially greater than the length of the Hall element 8; on the other hand, the thickness (radial dimension) and the width (circumferential dimension) of the rectangular bores 9b are substantially equal to the corresponding dimensions of the Hall elements 8. Thus, as best shown in FIG. 6, each Hall element 8 is completely accommodated in a bore 9b, to leave a small recess at the opening of the bore 9b, into which an adhesive 12a in the form of gel is filled to seal the Hall elements 8, wherein the leads 8a of the respective Hall elements 8 extend through the adhesive 12a. Incidentally, the radial thickness t of the holder 9a (see FIG. 6) across which the Hall elements 8 opposes the outer side surface of the sub-magnet 7 is preferred to be made as small as possible from the view point of the sensitivity of the Hall elements 8 to the magnetic field generated by the sub-magnet 7; however, due to a limitation imposed by the molding process of the holder 9a, the thickness t is selected at 0.5 to 0.8 mm.

After the Hall elements 8 are accommodated within the bores 9b and sealed by the adhesive 12a, a semi-circular disk-shaped one-sided printed circuit board 10 having a printed circuit pattern 10a at the back surface (at the right side in FIGS. 4 and 6) is attached to the base portion of the holder 9a; this is effected by means of a mortise and tenon joint as follows: the holder 9a comprises on the rear (abutting) surface of the base portion thereof a plurality of projections or tenons 9c, and these tenons 9c are fitted into respective holes (mortises) 10b formed in the printed circuit board 10 in registry therewith. The four leads 8a of the respective Hall elements 8 are passed through respective through holes 10c formed through the printed circuit board 10, and are electrically connected to the printed circuit pattern 10a via a solder 13. Thereafter, the holder 9a (accomodating the Hall elements 8) and the printed circuit board 10 thus assembled together are fixedly secured together to the bottom portion of the rear bracket 2b by means of a plurality of fixing screws 11, as best shown in FIG. 5. Thus, when the above mounting operation is completed, the three Hall elements 8 are positioned around the sub-magnet 7 to oppose the outer circumferential surface thereof across a small radial gap at a circumferential pitch of 60 degrees.

The advantages of the above mounting structure of the Hall elements 8 are as follows: First, the leads 8a and the electrical connections thereof to the pattern 10a on the printed circuit board 10 are protected from stress during assembly. Namely, since the holder 9a and the printed circuit board 10 are secured together by means of the mortise and tenon joint (the fitting projections 9c and the holes 10b thereof as shown in FIG. 6), an external force, which may be applied to the holder 9a and the printed circuit board 10 during assembly when they are mounted to the rear bracket 2b, does not cause any stress in the leads 8a. A second advantage is this: the leads 8a and the electrical connections thereof to the circuit pattern 10a via the solder 13 are protected from fatigue failure during the operation of the motor. Namely, since the Hall elements 8 are accommodated completely within the respective bores 9b in the holder 9a to which the printed circuit board 10 is secured by means of the mortise and tenon joint, repeated vibrations to which the leads 8a and the solder 13 may be subjected during the service operation of the motor do not result in the fatigue of the leads 8a or the solder 13. Further, since the Hall elements 8 are completely accommodated within the bores 9b and the adhesive 12a is filled in thereafter into the recess above the Hall elements 8 to seal the Hall elements 8, the application of the adhesive 12a does not require an expert skill, and the Hall elements 8 are effectively protected from water during the service operation of the motor.

Incidentally, the above description has been made with respect to the case where the motor is a 3-phase 4-pole brushless motor and three Hall elements are mounted at a circumferential pitch of 60 degrees. In such motors, however, the circumferential mounting pitch of the Hall elements may also be selected at 120 degrees. Further, it is pointed out that one and the same holder structure may be used for different types of brushless motors (e.g., having different number of poles, etc.) by forming a plurality of bores within the holder at such a circumferential pitch that the mounting circumferential pitch of the Hall elements required by a particular type of motor will become equal to an integral multiple of the circumferential pitch of the bores formed in such holder; then, in the assembly of a particular type of motor, the Hall elements are to be accommodated only in those bores which are separated from each other by the circumferential pitch required by that particular type of motor.

While the description has been made of a particular embodiment of this invention, it will be understood that many modifications may be made without departing from the spirit thereof; the appended claimed are contemplated to cover any such modifications as fall within the true spirit and scope of this invention.

What is claimed is:

1. A brushless motor having Hall elements for detecting the rotor position, comprising:
   a rotor having a rotor shaft rotatably supported by a housing structure of the motor, and a cylindrical main rotor magnet coaxially secured to said rotor shaft;
   a stator having stator coils supplied with currents whose directions are changed over in succession in response to a position of the rotor so as to drive and rotate the rotor;
   an annular sub-magnet secured to the rotor shaft at a side of the main rotor magnet, said sub-magnet having magnetic poles formed at an outer circumferential surface thereof;
   a holder of non-magnetic material having a semicircular cylindrical extension portion extending over and opposing the outer circumferential surface of the sub-magnet across a small radial gap, said extension portion having a plurality of rectangular bores formed therein at a predetermined circumferential pitch, each bore extending in an axial direction to open at an axial end, wherein each bore has sufficient dimensions to receive and accommodate a Hall element completely therein;
   a plurality of Hall elements accomodated within bores of said holder to be separated from each other by a predetermined circumferential pitch and to oppose the outer circumferential surface of the sub-magnet across a small radial gap, said Hall elements detecting the magnetic field generated by the sub-magnet to determine the position of the rotor; and
   a printed circuit board attached to said holder to close openings of said bores and having a printed circuit pattern formed on a back surface thereof opposite to a surface thereof attached to the holder, wherein leads of the Hall elements extend through through-holes formed in the printed circuit board to be electrically connected to the printed circuit pattern, and the holder and the printed circuit board fixedly secured to each other are mounted together to the housing structure of the motor.

2. A brushless motor as claimed in claim 1, wherein said holder and said printed circuit board are fixedly secured to each other by means of a mortise and tenon joint.

3. A brushless motor as claimed in claim 1 or 2, wherein said holder comprises a semicircular disk-shaped base portion from which said extension portion thereof axially extends, and said printed circuit board having a semicircular disk-shaped form is attached to the base portion of the holder in substantial alignment.

4. A brushless motor as claimed in claim 1 or 2, wherein each bore of said holder has an axial dimension substantially greater than a length of the Hall elements so that a recess is left in each bore at the opening thereof over the Hall element accommodated therein, and an adhesive is filled in into each recess to seal the Hall element.

5. A brushless motor as claimed in claim 1 or 2, wherein three bores are formed in said holder at a circumferential pitch of 60 degrees, each bore accommodating a Hall element therein.

* * * * *